(12) United States Patent
Patlolla et al.

(10) Patent No.: US 11,133,457 B2
(45) Date of Patent: Sep. 28, 2021

(54) CONTROLLABLE FORMATION OF RECESSED BOTTOM ELECTRODE CONTACT IN A MEMORY METALLIZATION STACK

(71) Applicant: International Business Machines Corporation, Armonk, NY (US)

(72) Inventors: Raghuveer Patlolla, Guilderland, NY (US); James J. Kelly, Schenectady, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/582,187

(22) Filed: Sep. 25, 2019

(65) Prior Publication Data

US 2021/0091303 A1   Mar. 25, 2021

(51) Int. Cl.
| | |
|---|---|
| *H01L 43/02* | (2006.01) |
| *H01L 27/22* | (2006.01) |
| *H01L 43/12* | (2006.01) |
| *H01L 43/10* | (2006.01) |
| *H01L 43/08* | (2006.01) |

(52) U.S. Cl.
CPC ............ *H01L 43/02* (2013.01); *H01L 27/222* (2013.01); *H01L 43/08* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 6,709,874 B2 | 3/2004 | Ning | |
| 7,064,064 B2 | 6/2006 | Chen et al. | |
| 7,473,641 B2 | 1/2009 | Ho et al. | |
| 8,822,234 B2 | 9/2014 | Wang et al. | |
| 9,691,971 B2 | 6/2017 | Nam et al. | |
| 9,985,075 B2 | 5/2018 | Chuang et al. | |
| 10,062,607 B2 | 8/2018 | Emesh et al. | |
| 2009/0289217 A1 | 11/2009 | Sato et al. | |
| 2017/0069684 A1* | 3/2017 | Suh | H01L 43/12 |
| 2017/0092692 A1* | 3/2017 | Kalnitsky | G01R 33/098 |
| 2017/0148849 A1* | 5/2017 | Chuang | H01L 43/12 |
| 2018/0240971 A1* | 8/2018 | Briggs | H01L 43/12 |
| 2018/0301505 A1* | 10/2018 | Chuang | H01L 23/53295 |
| 2018/0374895 A1* | 12/2018 | Hsu | H01L 23/5226 |

(Continued)

*Primary Examiner* — Victor A Mandala
(74) *Attorney, Agent, or Firm* — Fleit Intellectual Property Law; Thomas S. Grzesik

(57) ABSTRACT

A semiconductor device structure includes an MRAM metallization stack. A via is disposed within a dielectric cap layer that is on and in contact with the metallization stack. A liner is disposed on sidewalls and a bottom surface of the via. A recessed electrode contact is disposed within a portion of the via and in contact with a first part of the liner in contact with sidewalls of the via. A second part of the liner is in contact with the sidewalls is above a top surface of the contact. A method for forming the semiconductor device structure includes forming a via within a MRAM metallization stack. The via exposes a top surface of the second metal layer. An electrode contact is formed within a portion of the via. A cap layer is formed within a remaining portion of the via in contact with a top surface of the electrode contact.

11 Claims, 11 Drawing Sheets

(56) References Cited

U.S. PATENT DOCUMENTS

| | | |
|---|---|---|
| 2019/0027537 A1 | 1/2019 | Wiegand et al. |
| 2019/0058109 A1* | 2/2019 | Chen ................ H01L 45/04 |
| 2019/0252317 A1* | 8/2019 | Lu .................. H01L 21/0273 |
| 2020/0098982 A1* | 3/2020 | Chuang ............. H01L 43/12 |
| 2020/0127194 A1* | 4/2020 | Rizzolo ............ H01L 43/12 |
| 2020/0176510 A1* | 6/2020 | Wang ............... H01L 23/485 |

* cited by examiner

US 11,133,457 B2

CONTROLLABLE FORMATION OF RECESSED BOTTOM ELECTRODE CONTACT IN A MEMORY METALLIZATION STACK

BACKGROUND OF THE INVENTION

The present invention generally relates to the field of semiconductors, and more particularly relates to fabricating memory devices having recessed bottom electrode contacts.

Memory devices are often embedded or integrated on-chip to realize various advantages such as reduced chip number, increased response times, etc. Embedded memory devices may utilize technologies such as magnetic tunnel junctions, phase change materials, and/or the like. Components of the embedded memory devices are often susceptible to damage during subsequent processing and integration operations. For example, during formation of the bottom electrode contact the contact material may become uncontrollably recessed potentially resulting in process control issues such as within wafer, within chip, and wafer to wafer non uniformity.

SUMMARY OF THE INVENTION

In one embodiment, a method of forming a memory device structure comprises forming a metallization stack comprising at least a first metal layer in a logic area and at least a second metal layer in a memory area. A via is formed within the metallization stack, the via exposing a top surface of the second metal layer. A recessed electrode contact is formed within a portion of the via. A cap layer is formed within a remaining portion of the via in contact with a top surface of the electrode contact.

In another embodiment, a semiconductor device structure comprises a metallization stack comprising one or more patterned metal layers and a via within a dielectric cap layer disposed on and in contact with the metallization stack. The structure further comprises a barrier liner formed on sidewalls and a bottom surface of the via. A recessed electrode contact is disposed within a portion of the via and in contact with a first part of the barrier liner in contact with sidewalls of the via. A second part of the barrier liner in contact with sidewalls of the via is above a top surface of the recessed electrode contact.

In a further embodiment, a semiconductor device structure comprises a metallization stack comprising one or more patterned metal layers and a via within a dielectric cap layer disposed on and in contact with the metallization stack. The structure further comprises a barrier liner formed on sidewalls and a bottom surface of the via. An electrode contact is disposed within the via and in contact with the barrier liner. The electrode contact comprising a recessed area having a top surface that is below a top surface of portions of the electrode contact in contact with sidewalls of the barrier liner.

In another embodiment, a method for forming a memory device structure comprises forming a metallization stack comprising at least a first metal layer in a logic area and at least a second metal layer in a memory area. A top layer of the metallization stack is patterned to form at least one via therein, where the via exposes a top surface of the second metal layer. Liner material is conformally deposited, where a first portion of the liner material is deposited on a top surface of the metallization stack, and where a second portion of the liner material is deposited within the via to form a conformal liner therein. Electrode contact material is deposited. A first portion of the electrode contact material is deposited on the first portion of the conformal liner disposed above the via, and a second portion of the electrode contact material is deposited only within a partial portion of the via to form a recessed electrode contact therein. A capping material is deposited. A first portion of the capping material is deposited on the first portion of the electrode contact material, and wherein a second portion of the capping material is deposited within the via and in contact with the recessed electrode contact.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
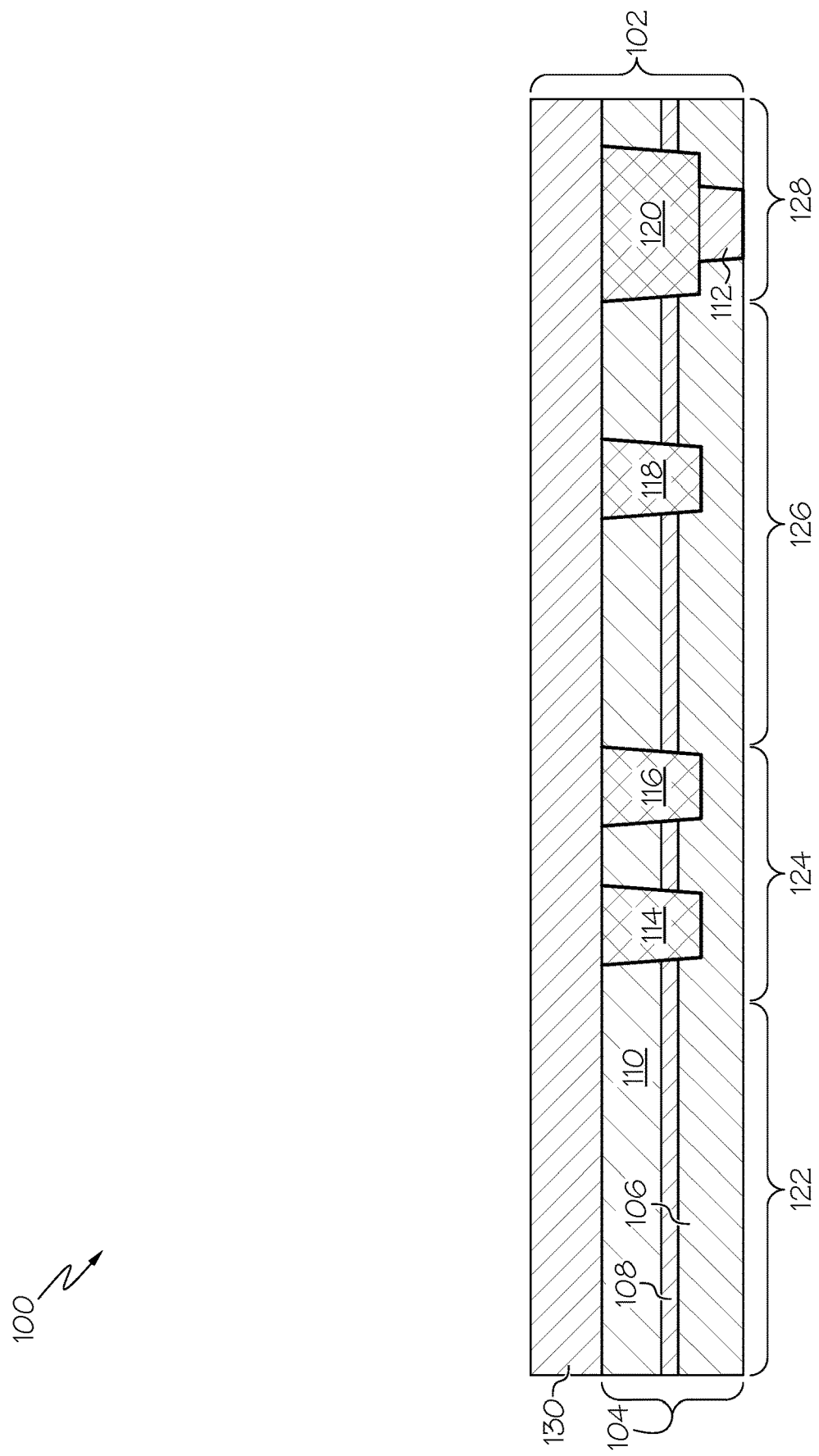
FIG. 1 is a cross-sectional view of a semiconductor device structure after a metallization stack has been formed according to one embodiment of the present invention.

It is to be understood that embodiments of the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

As discussed above, during formation of the bottom electrode contact the contact material may become uncontrollably recessed resulting in process control issues such as within wafer, within chip, and wafer to wafer non uniformity. This uncontrolled recess may cause topography related issues when additional levels are fabricated especially when magnetic tunnel junctions or other vias are formed these bottom vias (electrodes). These issues may affect the overall yield and device performance.

One or more embodiments of the present invention overcome these and other problems by, for example, by using an additive process that partially fills the bottom electrode via to form a recess instead of a performing a full fill process with subsequent partial metal dissolution. This allows embodiments of the present invention to avoid many difficult processing and integration problems. Embodiments of the present invention eliminate the variability from the metal recess process caused by, for example, the metal etching species due to fluid flow and diffusion effects; variations in local copper microstructure due to grain boundaries and varying copper grain size; and structural defects in the copper via due to narrow metallization process windows. In addition, the partial fill process of one or more embodiments provides improved control of within chip, within wafer, and wafer to wafer uniformity of the metal recess as compared to a subtractive metal recess process.

FIGS. 1-10 illustrate various processes for fabricating embedded memory devices according to one or more embodiments of the present invention. Referring now to FIG. 1, a semiconductor structure 100 is illustrated at point in time of the fabrication process after a metallization material stack 102 has been formed. In this example, the structure 100 comprises the metallization material stack 102 that includes one or more layers. A first or bottom portion 104 of the stack 102 may be disposed directly on a semiconductor stack. The bottom portion 104 of the stack 102 may be comprised of one or more layers including a first layer 106, a second layer 108, a third layer 110, etc.

The first layer 106 may comprise tetraethyl orthosilicate (TEOS), an oxide; a moderate-k, low-k, or ultra-low-k dielectric, and/or the like. The second layer 108 may be disposed on and in contact with the first layer 106 and may comprise a capping material such as silicon carbide, hydrogen and nitrogen doped silicon carbide, silicon nitride, and/or the like. The third layer 110 may be disposed on and in contact with the second layer 108 and comprise an insulating material such as a low-k dielectric, ultra-low-k dielectric, and/or the like. It should be noted that embodiments are not limited to the layers of the bottom portion 104 of the stack 102 shown in FIG. 1 as additional layers may be added and/or one or more layers may be removed.

In some examples, a dielectric insulating layer (not shown) may separate the second metallization layer 108 from the first metallization layer 106. This dielectric insulating layer may be used to separate at least some metal wiring, circuits, and junctions, in the second metallization layer 108 from making direct electrical contact with metal wiring, circuits, and junctions, in the first metallization layer 106. The dielectric insulating layer may be removed at selected locations to allow electrical interconnection, e.g., wiring and junctions, to extend from the second metallization layer 108 down to the first metallization layer 106, and/or further below to a semiconductor stack (not shown). The dielectric insulating layer may include, for example, dielectric material such as silicon oxide or carbon-doped oxide, or other low K dielectrics.

The bottom portion 104 of the stack 102 may be referred to as the "Mx layer" and may comprise patterned contacts/interconnects 112 and Mx metal layers/wires 114 to 120 embedded therein. In the example shown in FIG. 1, one or more patterned contacts/interconnects 112 are embedded within the first layer 106 while one or more Mx patterned metal layers 114 to 120 may be embedded within the first layer 106, second layer 108, and third layer 110 of the Mx layer. The one or more patterned contacts/interconnects 112 embedded within the first layer 106 may be a middle-of-line contact an may comprise tungsten, copper, cobalt, ruthenium, tantalum nitride, titanium nitride, aluminum, a combination thereof, and/or the like. Patterned Mx metal layers 114 to 120, in one example, may be metallization contacts comprising, tungsten, copper, cobalt, ruthenium, and/or the like. At least a first set of patterned Mx metal layers 114, 116 may be disposed within a logic area 124 of the structure 100 adjacent to a kerf region 122; a second set of Mx patterned metal layers 118 may be disposed within a logic to memory boundary area 126 of the structure 100; and a third set of Mx patterned metal layers 120 may be disposed within a logic to memory area 128 of the structure 100.

A second or top portion 130 of the metallization stack 102 may be disposed on the bottom portion 104 of the metallization stack 102. It should be noted that, in some embodiments, portion 130 may be considered separate from the metallization stack 102. Also, although the metallization material stack 102 may include the top portion 130 disposed directly on the bottom portion 104, in various embodiments the metallization material stack 102 may include one or more intervening metallization layers between the bottom and top portions 104, 130. That is, the top portion 130 of the metallization stack 102 would be disposed on one or more intervening metallization layers, or other material layers, which would be disposed on the bottom portion 104 of the metallization stack 102. In one embodiment, the top portion 130 of the metallization stack 102 may comprise one or more dielectric materials such as silicon carbonitride (SiCN: H), silicon carbide, hydrogen and nitrogen doped silicon carbide, silicon nitride, and/or the like. Accordingly, at least in some embodiments, the top portion 130 of the metallization stack 102 may also be referred to as a "dielectric cap layer 130".

Figure 2:
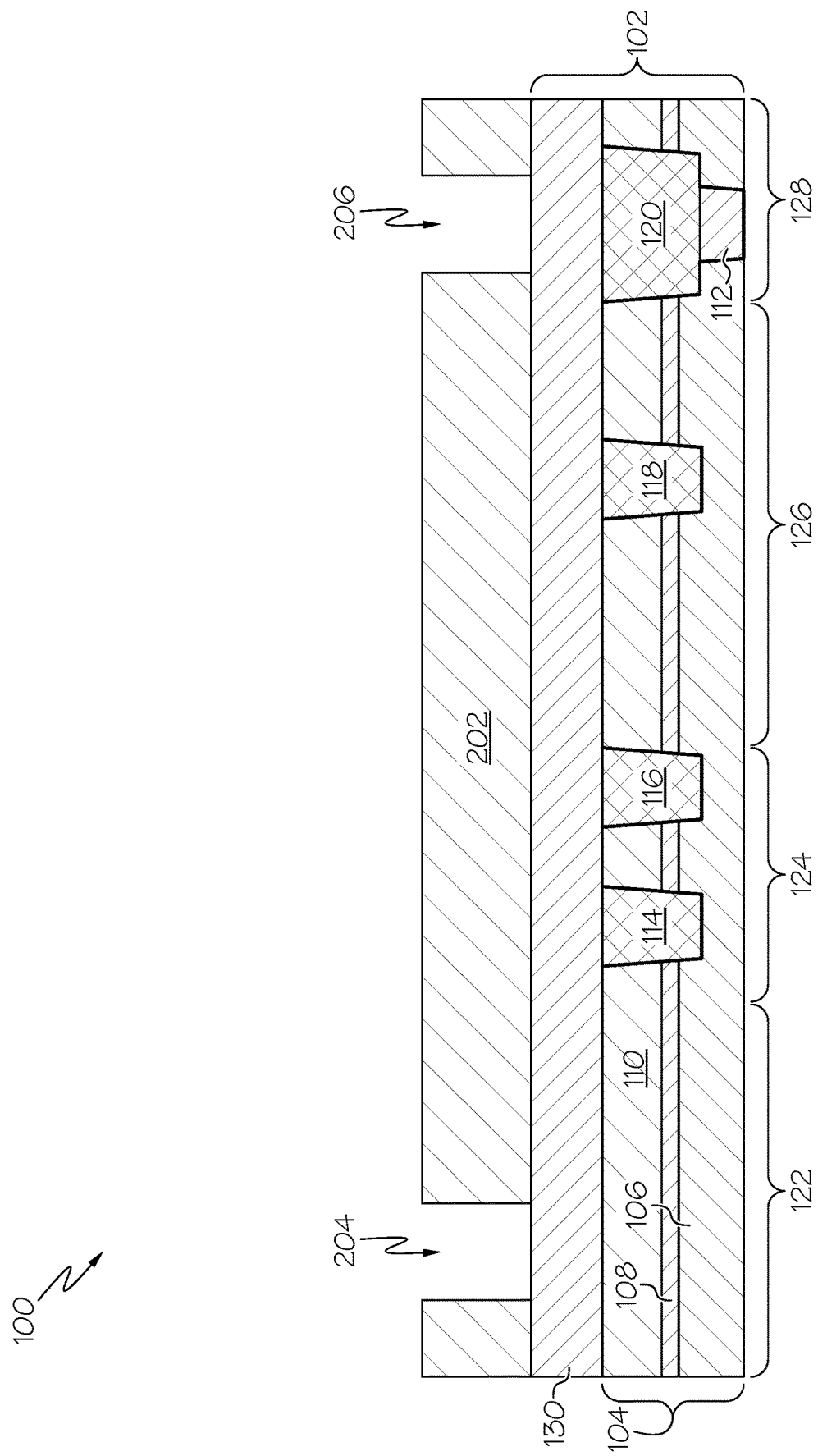
FIG. 2 is a cross-sectional view of the semiconductor device structure after a patterning stack has been formed over the metallization stack according to one embodiment of the present invention.

FIG. 2 shows that one or more patterning stacks 202 may be formed on and in contact with a top surface of the dielectric cap layer 130. The patterning stack 202 may be a tri-layer stack, quad-layer stack, or any other applicable patterning stack configuration. In one example, the patterning stack 202 may comprise an organic planarization layer (OPL), an anti-reflective coating (ARC), and a photoresist layer. The OPL may include a material(s) such as spin-on carbon (SOC), diamond-like carbon, polyarylene ether, polyimide, polymethyl methacrylate, polymethylisopropenyl ketone, photoresists, and/or the like. The OPL may be formed utilizing any conventional deposition process including, for example, CVD, PVD, plasma enhanced chemical vapor deposition (PECVD), evaporation, spin coating, and dip coating. Chemical mechanical planarization (CMP) and/or grinding may be used to planarize the deposited OPL.

The ARC layer may comprise a silicon-ARC, titanium-ARC, and/or the like. The ARC layer may be formed by, for example, one or more processes including sputtering, evaporation, CVD, PVD, ALD, and/or the like. The photoresist layer may comprise a material that is sensitive to one or more types of patterning processes such extreme ultraviolet (EUV) light patterning and/or the like. The photoresist layer may be deposited using one or more processes such as CVD, PVD, ALD, and/or the like.

The photoresist layer may be patterned using any suitable photolithography technique. For example, in on embodiment, a photomask is disposed over the photoresist layer. The photoresist layer may then be exposed to a radiation beam, and then hardened via a curing or baking process. Unexposed or exposed portions of the photoresist layer may then be removed using a developer. The foregoing process results in the desired pattern. The pattern includes portions of the photoresist layer in contact with ARC layer while other portions of the ARC layer remain exposed. In some embodiments, the portions of the photoresist layer may be trimmed using, for example, an anisotropic plasma etch process.

After the photoresist layer has been patterned, the pattern is transferred down to the remaining layers of the stack 202 via one or more etching processes as shown in FIG. 2. For example, a selective etching process may be used to first transfer the pattern to the ARC layer. A separate selective etching process may then be used to transfer the pattern to the OPL. Alternatively, the ARC layer and the OPL may be etched using a single etching process. The resulting patterning stack 202 comprises one or more open areas 204, 206 exposing portions of the top surface of the dielectric cap layer 130 over the kerf region 122 and over the Mx metal layer 120 in the memory region 128.

Figure 3:
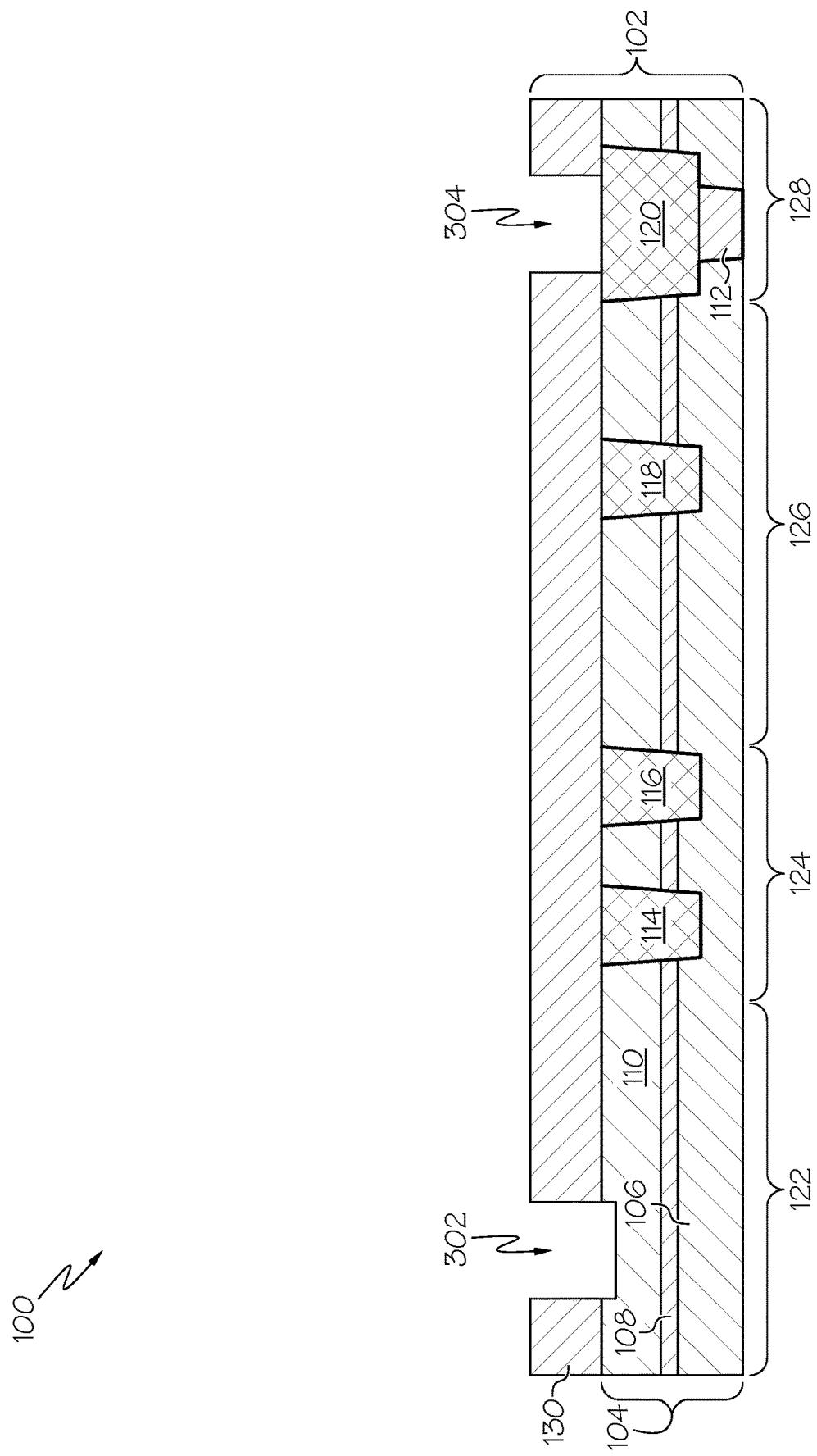
FIG. 3 is a cross-sectional view of the semiconductor device structure after vias have been formed in a top layer of the metallization stack according to one embodiment of the present invention.

One or more etching processes may then be used to transfer the pattern down to the dielectric cap layer 130 as shown in FIG. 3. In one embodiment, the exposed portions of the dielectric cap layer 130 are etched away to form one or more vias/trenches 302, 304. A first via 302 may expose a portion of top surface of the underlying ILD layer 110 in the kerf region 122 and a second via 304 may expose at least a portion of top surface of the underlying Mx metal layer 120 in the memory region 128. In some embodiments, the etching process may extend partially down into the underlying ILD layer 110 and/or the underlying Mx metal layer 120.

Figure 4:
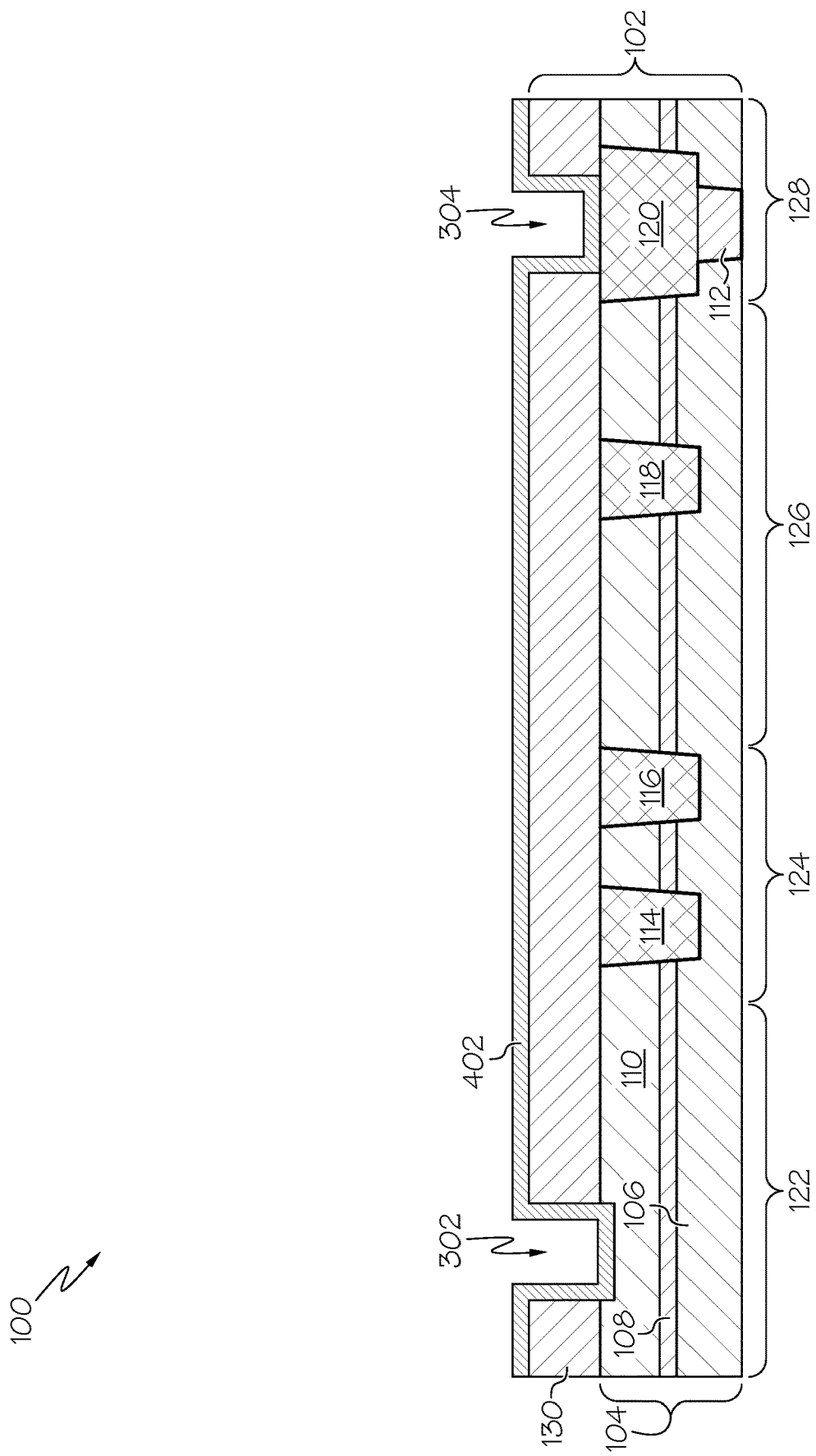
FIG. 4 is a cross-sectional view of the semiconductor device structure after a barrier liner has been formed over the structure according to one embodiment of the present invention.

FIG. 4 shows that a barrier liner 402 may be formed using CVD or ALD process. The liner 402 may be formed on and in contact with a top surface of the dielectric cap layer 130; sidewalls of the vias 302, 304; and the exposed top surface portion of the ILD layer 110; and the exposed top surface portion of the Mx metal layer 120. In one embodiment, the liner 402 may comprise materials such as (but not limited to) such as cobalt, tungsten, tungsten nitride, tantalum nitride, titanium nitride, aluminum, and/or the like.

Figure 5:
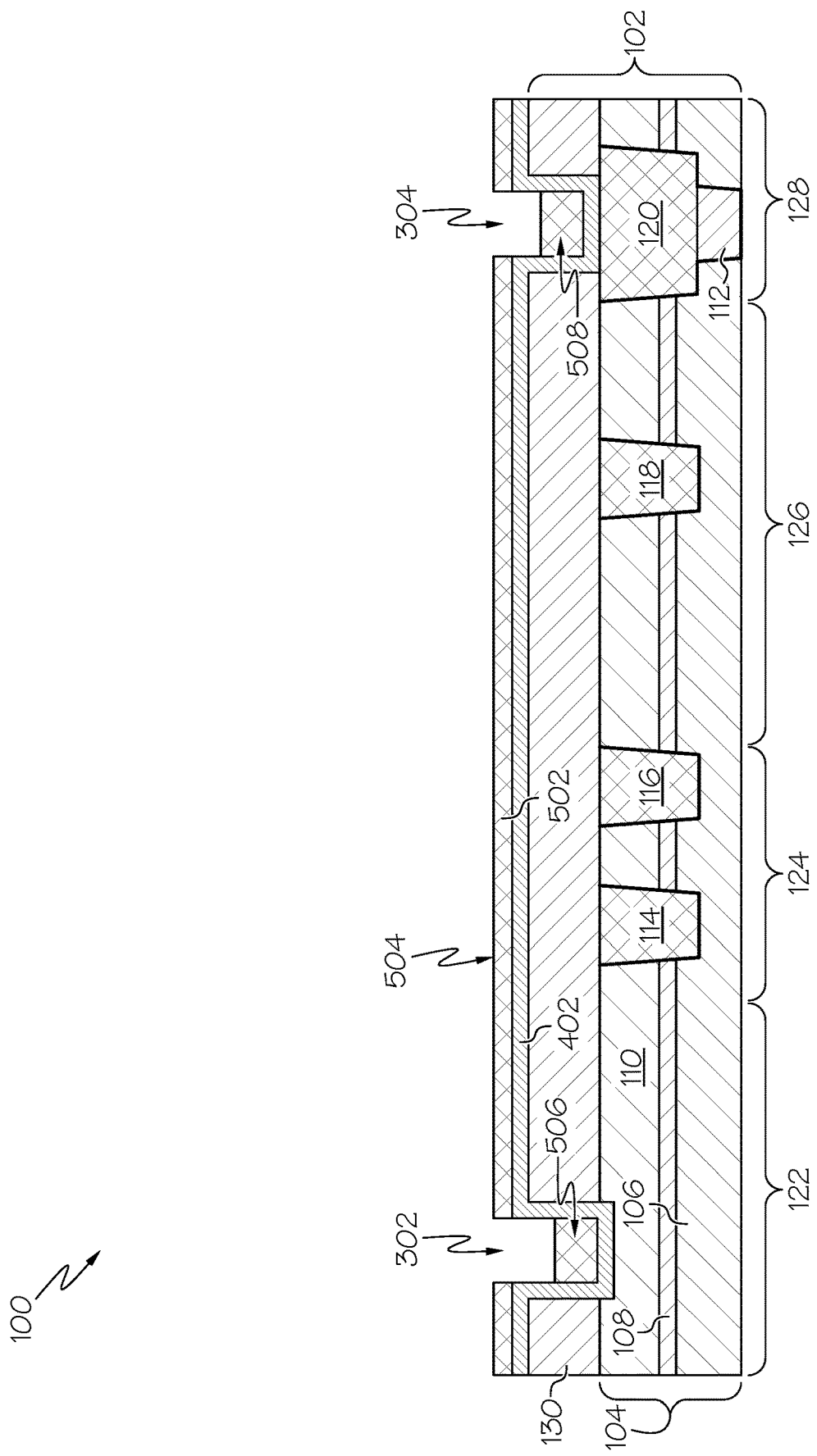
FIG. 5 is a cross-sectional view of the semiconductor device structure after a recessed contact layer has been formed partially within the vias according to one embodiment of the present invention.

FIG. 5 shows that the a contact/interconnect layer 502 comprising, for example, copper, tungsten, cobalt, ruthenium, and/or the like may be formed/deposited on the structure 100. For example, the contact layer 502 may be formed by depositing copper via PVD followed a reflow process performed to flow the contact material partially into the vias 302, 304. An optional anneal may then performed to condense the contact/interconnect material, depending on the requirement for final layer quality, thermal budget, and throughput. The anneal can also be done as part of the reflow. In an embodiment that utilizes plating to partially fill the vias 302, 304 with contact material, the plating additive chemistry provides bottom-up filling resulting in a partially filled structure. The process time may be controlled such that only partial filling is obtained. In an embodiment were a reflow process is utilized, the surface energy between the contact material to be reflowed and the substrate material causes the top layer to either spread (or "wet") over the bottom surface. The contact material and the substrate may be selected such that the contact material prefers to spread out upon annealing.

As a result of the deposition/formation process, the contact layer 502 comprises a first portion 504 in contact with the top surface of the portions of the barrier liner 402 formed on the top surface of the dielectric cap layer 130; a second portion 506 that partially fills the via 302 in the kerf region 122; and a third portion 508 that partially fills the via 304 in the memory area 128. The second portion 506 of the contact layer 502 may be formed in contact with a portion of the sidewalls of the barrier liner 402 formed within the via 302 and may further contact the portion of the barrier liner 402 formed in contact with the ILD layer 110 in the kerf region 122. The third portion 508 of the contact layer 502 may be formed in contact with a portion of the sidewalls of the barrier liner 402 formed within the via 304 and may further contact the portion of the barrier liner 402 formed in contact with the Mx metal layer 120 in the memory area 128.

The portions 506, 508 of the contact layer 502 formed within the vias 302, 304 may comprise a top surface that is below the top surface of the dielectric cap layer 130. In some examples, the vias 302, 304 may be filled between (and including) 50-80% with the contact material although other amounts are applicable as well. The height of the contact layer portions 506, 508 within the vias 302, 304 may vary between (and including) 30 nm to 150 nm although lesser and greater heights are applicable as well.

Figure 6:
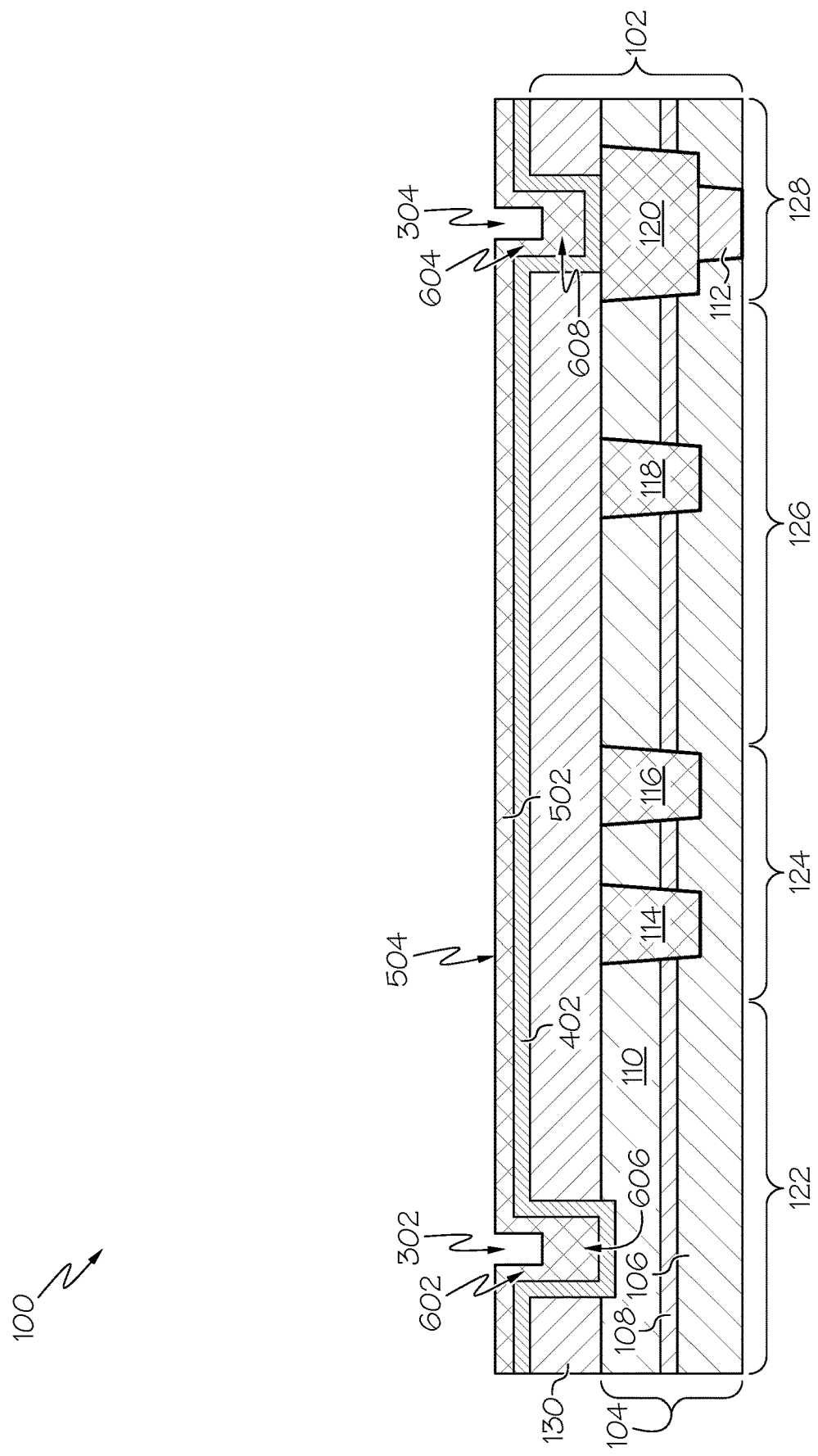
FIG. 6 is a cross-sectional view of the semiconductor device structure after a recessed contact layer has been formed on partially within the vias according to another embodiment of the present invention.

In another embodiment, the contact layer 502 may be formed using a seed such as a copper seed deposited via PVD followed by copper plating, though chemical vapor deposition (CVD) techniques could be used as well. This process results in contact layer 502 forming on the sidewalls of the liner 402 within the vias 302, 304 with a recessed portion therebetween as shown in FIG. 6. For example, FIG. 6 shows portions 602, 604 of the contact layer 502 conforming to the sidewalls of the liner 402 within the vias 302, 304. FIG. 6 further shows that a recessed portion 606, 608 of the contact layer 502 is formed between the sidewall conformal portions 602, 604 of the contact layer 502. The recessed portion 606, 608 comprises a top surface that is below the top surface of the sidewall conformal portions 602, 604 of the contact layer 502.

Figure 7:
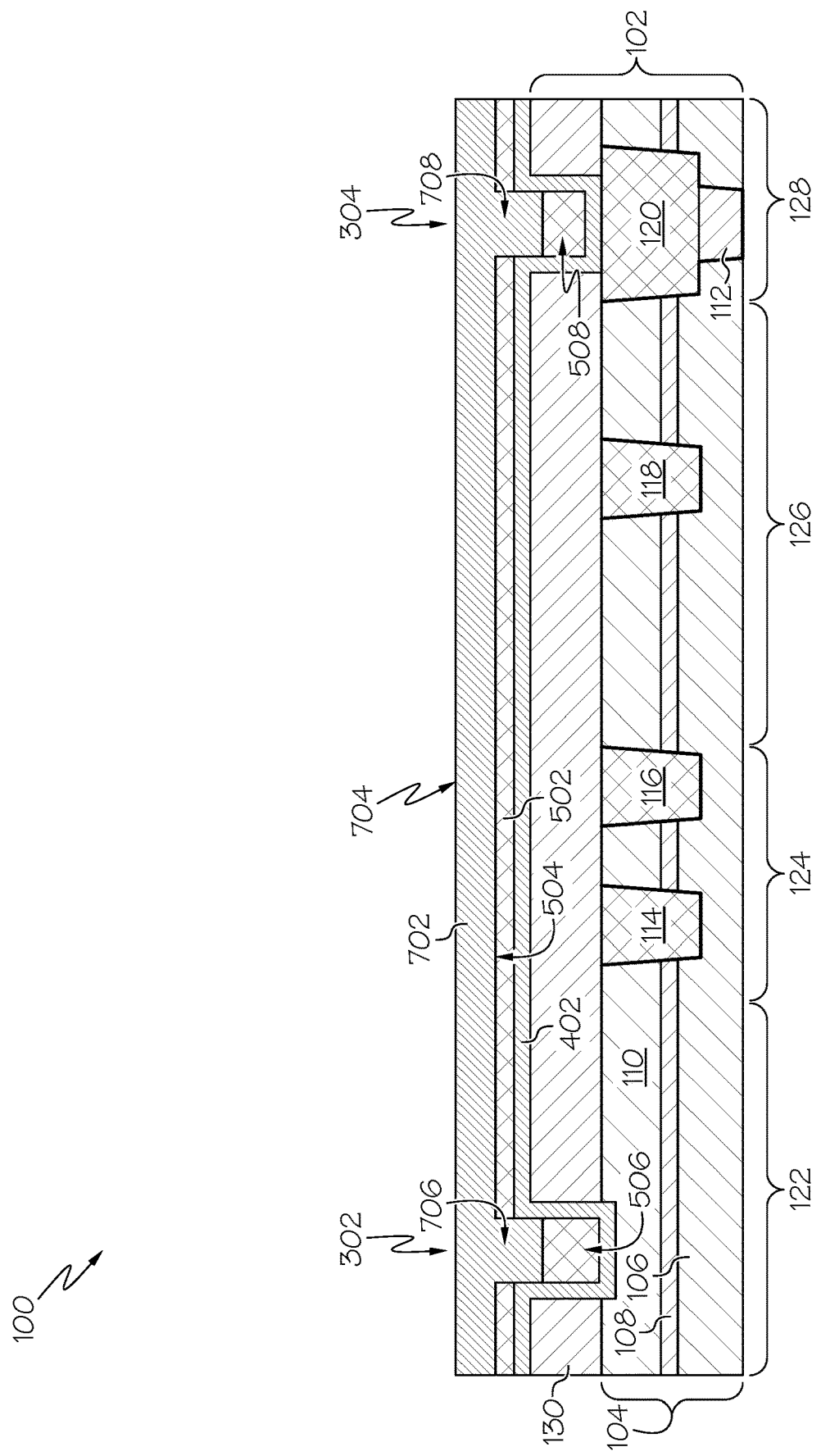
FIG. 7 is a cross-sectional view of the semiconductor device structure after a cap layer has been formed over on the structure and within remaining portions of the via according to one embodiment of the present invention.

After the contact layer 502 has been formed, a capping layer 702 may be formed as shown in FIG. 7. The capping layer 702 may comprise a first portion 704 formed on and in contact with a top surface of the first portion 504 of the contact layer 502; a second portion 706 formed within the via 302 in the kerf region 122; and a third portion 708 that partially fills the via 304 in the memory area 128. The second portion 706 of the capping layer 702 may fill the remaining portions of the via 302 and contact a top surface of the second portion 506 of the contact layer 502 and exposed sidewalls of the barrier liner 402 formed within the via 302. The third portion 608 of the capping layer 702 may fill the remaining portions of the other via 304 and contact a top surface of the third portion 508 of the contact layer 502 and exposed sidewalls of the barrier liner 402 formed within the via 304.

Figure 8:
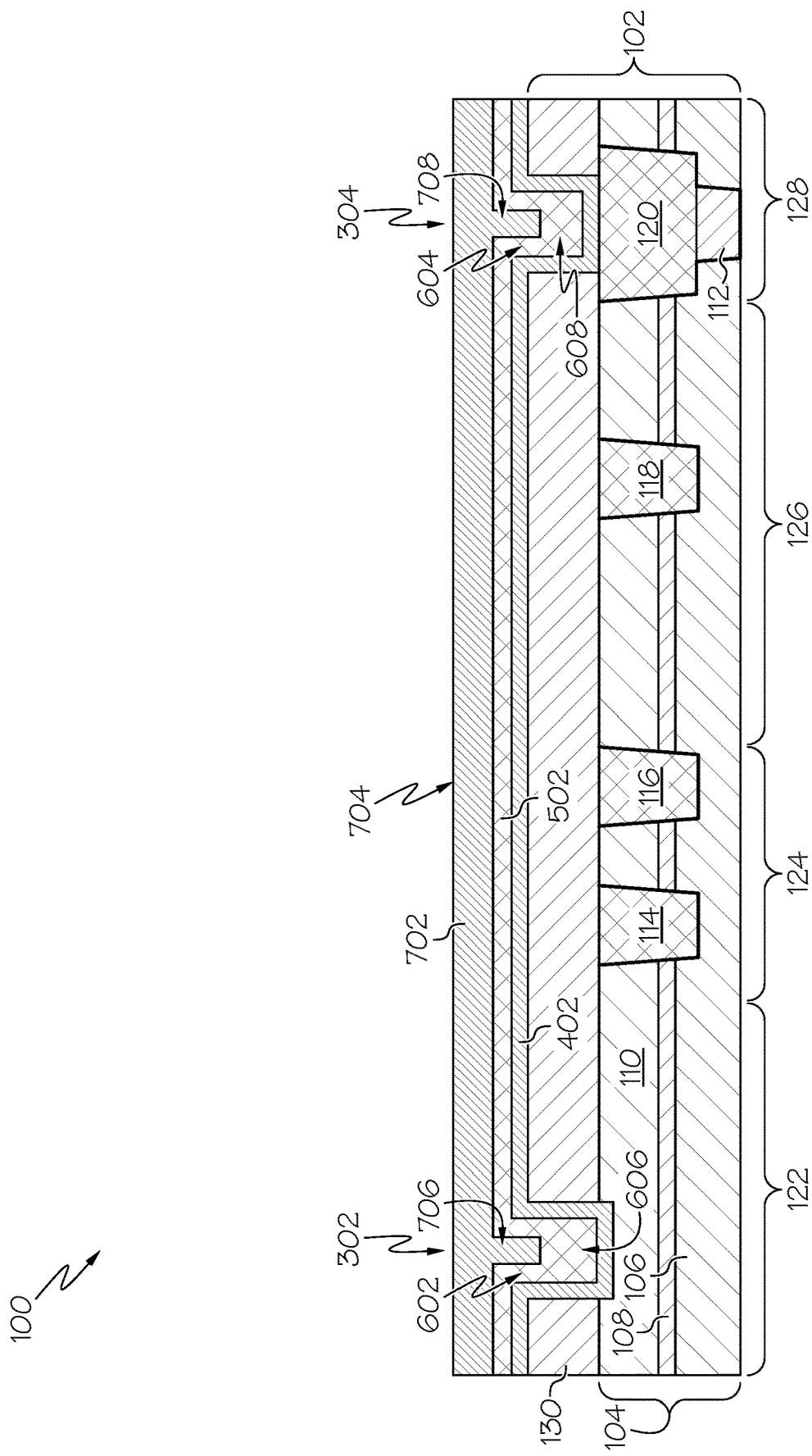
FIG. 8 is a cross-sectional view of the semiconductor device structure after a cap layer has been formed over on the structure and within remaining portions of the via according to another embodiment of the present invention.

In one embodiment, the capping layer 702 may be formed using a CVD or ALD process and may comprise materials such as (but not limited to) such as cobalt, tungsten, tungsten nitride, tantalum nitride, titanium nitride, aluminum, and/or the like. If wide lines are present, a seed layer such as (but not limited to) a PVD copper seed may be deposited over the capping layer 702. Electrodeposition of a metal such as copper may then performed to fill the wide lines. A post copper plate anneal may then be employed followed by CMP to planarize the plated copper. The CMP may stop on the capping layer 702. FIG. 8 shows the capping layer 702 being formed on the structure 100 discussed with respect to FIG. 6. In this embodiment, the second and third portions 706, 708 of the capping layer 702 contact a top surface of the contact layer recessed portions 606, 608 and further contact the sidewall conformal portions 602, 604 of the contact layer 502.

Figure 9:
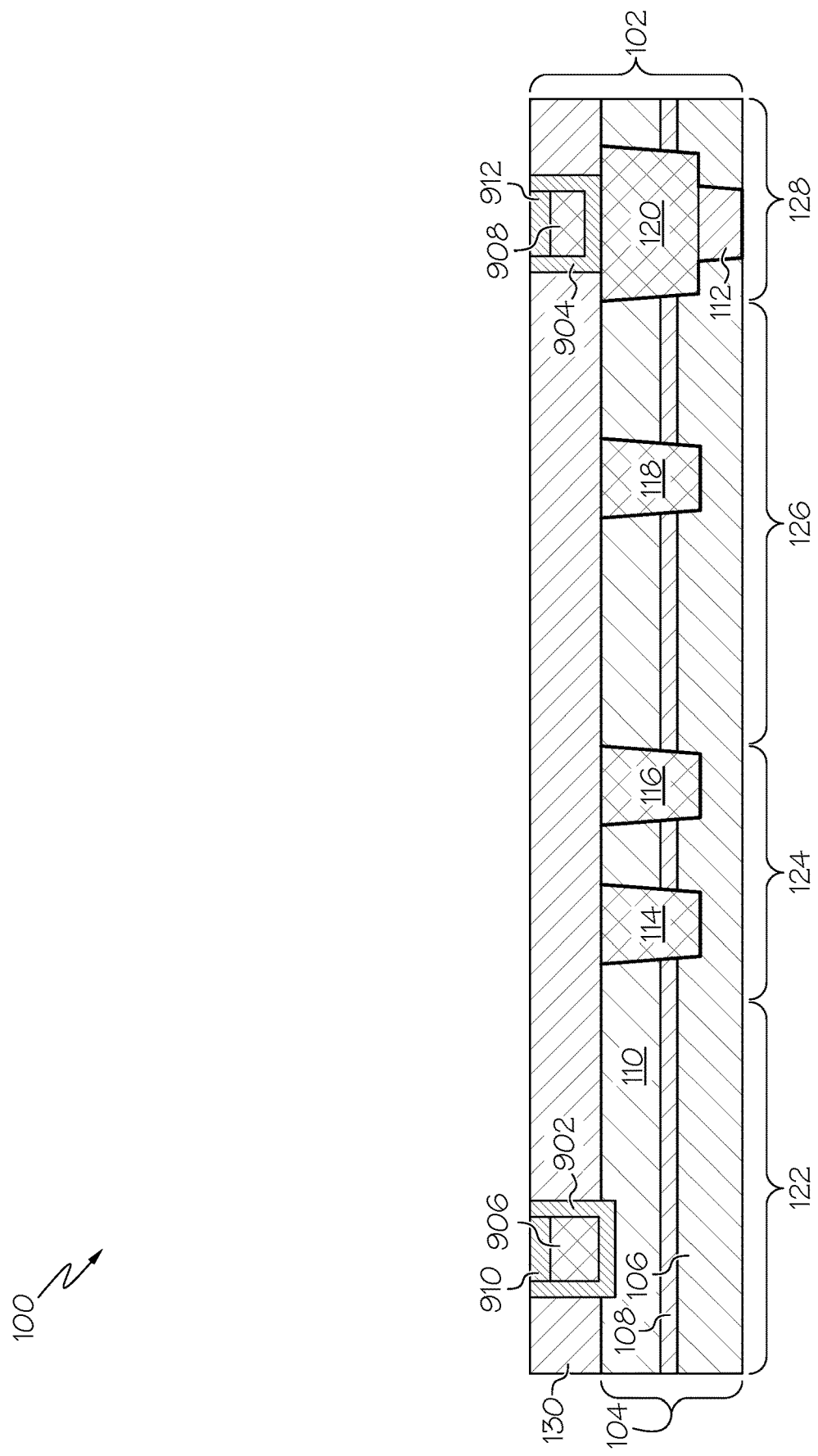
FIG. 9 is a cross-sectional view of the semiconductor device structure after excess cap layer material, contact layer material, and liner material have been removed according to one embodiment of the present invention.

After the capping layer 702 has been formed, portions 504 of the liner 402; portions 504 of the contact layer 502; and portions 704 of the capping layer 702 disposed above the top surface dielectric cap layer 130 may be removed as shown in FIG. 9. The portions of the liner 402 remaining within the vias 302, 304 may be referred to as via liners 902, 904. The portions 506, 508 (or 606, 608 from FIG. 6) of the contact layer 502 remaining within the vias 302, 304 may be referred to as bottom electrode contacts 906, 908 or via contacts 906, 908. The portions 706, 708 of the capping layer 702 in contact with the bottom electrode contacts 906, 908 may be referred to as cap layers 910, 912. The portions 504 of the liner 402, portions 504 of the contact layer 502, and the portions 704 of the capping layer 702 may be removed using a one-step CMP process, a two-step CMP process, a wet etching process, and/or the like.

Figure 10:
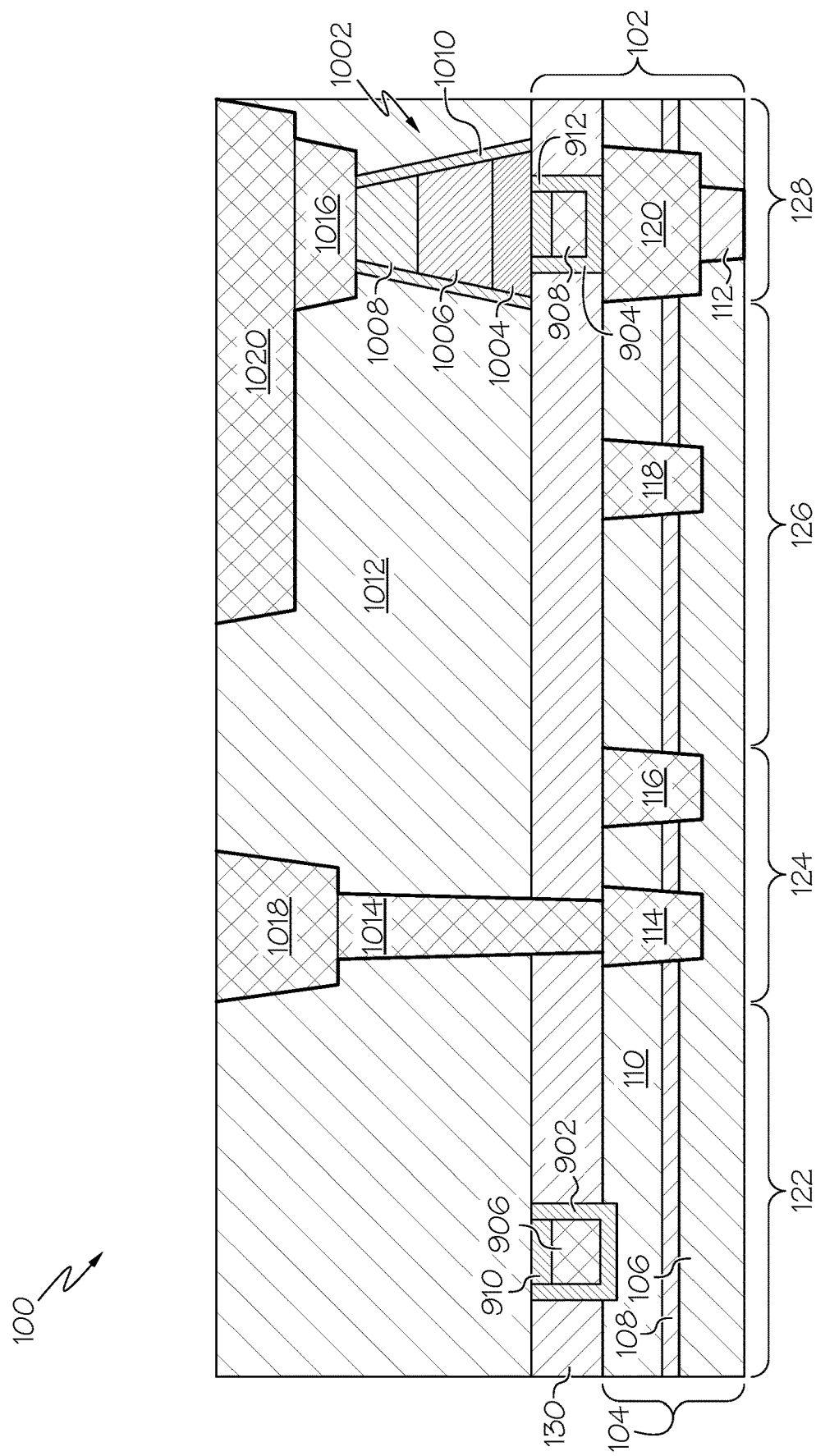
FIG. 10 is a cross-sectional view of the semiconductor device structure after a memory device has been formed on the metallization stack according to one embodiment of the present invention.

FIG. 10 shows that further processing may be performed to one or more memory devices on the metallization material stack 102. For example, FIG. 10 shows that a memory device 1002, such as a magneto-resistive random-access memory (MRAM), has been formed on the metallization material stack 102 in the memory region 128. The memory device 1002 may comprise a bottom electrode 1004, a magnetic tunnel junction (MTJ) stack 1006, and a top electrode 1008. The bottom electrode 1004 may be formed on and in contact with the cap layer 912 and may comprise materials such as (but not limited to) tungsten, tungsten nitride, tantalum, tantalum nitride, titanium, titanium nitride, ruthenium, aluminum, other high melting point metals, conductive metal nitrides, a combination thereof, and/or the like.

The MTJ stack 1006 may be formed on and in contact with the bottom electrode 1004 and may comprise a plurality of layers. The MTJ stack layers may comprises a first magnetic layer formed on and in contact with the bottom electrode 1004. An insulating layer (e.g., tunnel barrier) may then be deposited over and in contact with the first magnetic layer. A second magnetic layer may then be deposited over and in contact with the insulating layer. This pattern of layers may be repeated a desired number of times. The first and second magnetic layers may comprise a magnetic material such as, but not limited to, cobalt (Co), iron (Fe), boron (Ba, CoFeB alloys, Co/Pt multilayers, Co/Ni multilayers, similar ferromagnetic multilayer materials or alloys with transition metals or rare earth metals, any combination thereof, and/or the like. The insulating layer may comprise materials such as, but not limited to, magnesium oxide (MgO), aluminum oxide (AlOx), and/or the like. It should be noted that additional barrier layers (not shown) may also be formed/deposited as part of the MTJ stack as well.

One of the magnetic layers has a high level of magnetization and is fixed/pinned (reference layer). The other magnetic layer has a lower amount of magnetization and is referred to as the free layer (i.e., not pinned). The free layer is able to rotate its magnetization to be parallel with the pinned layer or anti-parallel to the pinned layer. Parallel magnetizations allow current to tunnel through the tunnel barrier resulting in low resistance. Anti-parallel magnetizations do not allow current to tunnel through the tunnel barrier resulting in high resistance. The magnetizations can be controlled either by passing current through a different copper line so that the current induces a magnetic field that interacts with the free layer or by directly injecting spin polarized current into the device which produces a torque on the magnetic free layer.

The top electrode 1008 may be formed on and in contact with the MTJ stack and may comprise metals such as (but not limited to) tungsten, copper, cobalt, ruthenium, tantalum nitride, titanium nitride, aluminum, and/or the like. The bottom electrode 1004, MTJ stack 1006, and top electrode 1008 may be formed using one or more deposition and patterning processes known to those skilled in the art. FIG. 10 further shows that an encapsulation layer 1010 is formed on and in the memory device 1002 and may comprise silicon carbide, hydrogen and nitrogen doped silicon carbide, silicon nitride, and/or the like over.

FIG. 10 further shows an ILD layer 1012 formed in contact with the dielectric cap layer 130 and the encapsulation layer 1010 and further formed above a top surface of the memory device 1002. At least a first via may be formed within the ILD 1012 in the logic area 124 comprising a logic via contact/interconnect 1014 in contact with an Mx logic metal layer 114. At least a second via may be formed within the ILD 1012 in the memory area 126 comprising a memory via contact/interconnect 1016 in contact with an Mx memory metal layer 120. One or more metal layer/wires 1018, 1020 may be formed in contact with the one or more via contacts 1014, 1016. Copper, cobalt, tungsten, aluminum, a combination thereof, and/or other materials may be used to form the contacts 1014, 1016 and metal layers/wires 1018, 1020. A liner may be formed in contact with the via contacts 1014, 1016 and the metal layers/wires 1018, 1020 similar to the barrier liner 402 discussed above.

Figure 11:
FIG. 11 is an operational flow diagram illustrating one example of a process for forming a memory device metallization stack comprising a recessed bottom electrode according to one embodiment of the present invention.

FIG. 11 is an operational flow diagram illustrating one example of a process for forming a memory device metallization stack comprising a recessed bottom electrode according to one embodiment of the present invention. It should be noted that each of the steps shown in FIG. 11 has been discussed in greater detail above with respect to FIGS. 1 to 10. A metallization stack comprising at least a first metal layer in a logic area and at least a second metal layer in a memory area is formed at step 1102. A via is formed within the metallization stack at step 1104. The via exposes a top surface of the second metal layer. A recessed electrode contact is formed within a portion of the via at step 1106. A cap layer is formed within a remaining portion of the via in contact with a top surface of the electrode contact at step 1108.

Although specific embodiments of the invention have been taught, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A method for forming a memory device structure, the method comprising:
   forming a metallization stack comprising at least a first metal layer in a logic area and at least a second metal layer in a memory area;
   forming a via within the metallization stack, the via exposing a top surface of the second metal layer;
   forming a liner within the via;
   forming an electrode contact within a portion of the via and in contact with the liner;
   forming a cap layer within a remaining portion of the via in contact with a top surface of the electrode contact; and
   removing a portion of the cap layer such that a top surface of the cap layer and a top surface of the liner are coplanar.

2. The method of claim 1, wherein forming the liner comprises:
   forming a first portion of liner material on and in contact with a top surface of the metallization stack;
   forming a second portion of the liner material on and in contact with sidewalls of the via; and
   forming a third portion of the liner material on and in contact with a bottom surface of the via.

3. The method of claim 2, wherein forming the electrode contact comprises:
   forming a first portion of electrode contact material on and in contact with the first portion of the liner material;
   forming a second portion of the electrode contact material on and in contact with the second portion of the liner material; and forming a third portion of the electrode contact material on and in contact with the third portion of the liner material and between inner sidewalls of the second portion of the electrode contact material, wherein a height of the second portion of the electrode contact material is greater than a height of the third portion of the electrode contact material.

4. The method of claim 2, wherein forming the electrode contact comprises:
forming a first portion of electrode contact material on and in contact with the first portion of the liner material;
forming a second portion of the electrode contact material on and in contact with a first part of the second portion the liner material such that a second part of the second portion of the liner material remains exposed; and
forming a third portion of the electrode contact material on and in contact with the third portion of the liner material.

5. The method of claim 4, wherein forming the cap layer comprises:
forming cap layer material on and in contact with
the first portion of the electrode contact material above the top surface of the metallization stack,
the exposed second part of the second portion of the liner material formed on and in contact with sidewalls of the via, and
a top surface of the second portion of the electrode contact material.

6. The method of claim 5, further comprising:
removing
portions of the cap layer material,
the first portion of the electrode contact material, and
the first portion of liner material.

7. A method for forming a memory device structure, the method comprising:
forming a metallization stack comprising at least a first metal layer in a logic area and at least a second metal layer in a memory area;
patterning a top layer of the metallization stack to form at least one via therein, the via exposing a top surface of the second metal layer;
conformally depositing liner material, wherein a first portion of the liner material is deposited on a top surface of the metallization stack, and wherein a second portion of the liner material is deposited within the via to form a conformal liner therein;
depositing electrode contact material, wherein a first portion of the electrode contact material is deposited on the first portion of the conformal liner disposed above the via, and wherein a second portion of the electrode contact material is deposited only within a partial portion of the via to form a recessed electrode contact therein; and
depositing a capping material, wherein a first portion of the capping material is deposited on the first portion of the electrode contact material, and wherein a second portion of the capping material is deposited within the via and in contact with the recessed electrode contact.

8. The method of claim 7, further comprising:
removing the first portion of the capping material, the first portion of the electrode contact material, and the first portion of the liner material thereby exposing a top surface of the metallization stack, a top surface of the conformal liner, and a top surface of the second portion of the capping material.

9. The method of claim 8, further comprising:
forming a bottom electrode in contact with the top surface of the metallization stack, the top surface of the conformal liner, and the top surface of the second portion of the capping material;
forming a magnetic tunnel junction stack in contact with a top surface of the bottom electrode; and
forming a top electrode in contact with the magnetic tunnel junction stack.

10. The method of claim 7, wherein the second portion of the electrode contact material is deposited such that sidewalls of the conformal liner within the via are covered by the second portion of the electrode contact material and a recess is formed within the second portion of the electrode contact material.

11. The method of claim 7, wherein depositing the capping material further comprises:
depositing the second portion of the capping material in contact with a portion of sidewalls of the conformal liner.

* * * * *